United States Patent

Fujii et al.

[11] Patent Number: 6,163,688
[45] Date of Patent: Dec. 19, 2000

[54] OSCILLATOR AND COMMUNICATIONS DEVICE

[75] Inventors: Yasutaka Fujii, Najaokakyo; Koichi Sakamoto, Otsu; Sadao Yamashita, Kyoto; Kenichi Iio, Nagaokakyo; Takehisa Kajikawa, Osaka, all of Japan

[73] Assignee: Murata Manufacturing Co., Ltd., Japan

[21] Appl. No.: 09/315,737

[22] Filed: May 20, 1999

[30] Foreign Application Priority Data

May 22, 1998 [JP] Japan ................... 10-141420

[51] Int. Cl.$^7$ ............................................ H04B 1/26
[52] U.S. Cl. ......................... 455/318; 455/323; 331/68; 331/99
[58] Field of Search ............................ 455/318, 321, 455/325, 327; 331/68, 99, 117, 117 R

[56] References Cited

U.S. PATENT DOCUMENTS

| | | | |
|---|---|---|---|
| 4,219,779 | 8/1980 | Shinkawa et al. | 455/321 |
| 4,321,560 | 3/1982 | Nishikawa et al. | 331/99 |
| 4,591,806 | 5/1986 | Havens . | |
| 4,618,836 | 10/1986 | Gannon et al. | 331/96 |
| 5,140,285 | 8/1992 | Cohen | 331/96 |
| 5,262,736 | 11/1993 | Watanabe | 331/68 |
| 5,345,194 | 9/1994 | Nagasako | 331/99 |
| 5,578,969 | 11/1996 | Kain | 33/140 |
| 5,697,090 | 12/1997 | Iura | 455/316 |
| 5,801,590 | 9/1998 | Kashima et al. | 331/68 |
| 5,818,880 | 10/1998 | Kriz et al. | 375/306 |
| 5,834,981 | 11/1998 | Trier et al. | 331/99 |
| 6,081,696 | 6/2000 | Wong | 455/103 |

FOREIGN PATENT DOCUMENTS

| | | |
|---|---|---|
| 60-140905 | 7/1985 | Japan . |
| 5-152845 | 6/1993 | Japan . |
| 7-122932 | 5/1995 | Japan . |
| 8-307119 | 11/1996 | Japan . |
| 10224104 | 8/1998 | Japan . |

*Primary Examiner*—Fan Tsang
*Assistant Examiner*—Blane J. Jackson
*Attorney, Agent, or Firm*—Ostrolenk, Faber, Gerb & Soffen, LLP

[57] ABSTRACT

An oscillator comprises a dielectric resonator, a circuit board, and an adjustment mechanism for adjusting the relative positional relationship between the dielectric resonator and the circuit board; the dielectric resonator having a dielectric substrate, electrodes provided on two opposite faces of the dielectric substrate, and electrode removal portions provided at predetermined positions on the electrodes; and the adjustment mechanism comprising screws and springs for moving the dielectric resonator.

14 Claims, 5 Drawing Sheets

OSCILLATOR AND COMMUNICATIONS DEVICE

BACKGROUND OF THE INVENTION

1. Field of the Invention

The present invention relates to an oscillator and a communications device used in microwave and milliwave bands and the like.

2. Description of the Related Art

By way of background, an oscillator will be discussed as shown in FIG. 5, it being understood that this oscillator was not publicly known or described in any publication when the present invention was realized and, therefore, is not prior art to the instant invention.

Oscillator 110 comprises a cap 111, a circuit board 140, a dielectric resonator 120, a case 130 and a stem 112. The cap 111 and the stem 112 are made of steel, and terminal pins 113 connect to the stem 112.

The circuit board 140 comprises a circuit pattern, such as a stripline, provided on an insulated substrate. Elements such as a FET 142, a chip capacitor 143 and a chip resistor 144 are mounted at predetermined positions on the circuit board 140, and are connected together. The terminal pins 113 and holes 155a, 155b and 155c, having roughly the same shape as the terminal pins 113, are provided at three corners of the circuit board 140, and terminal electrodes 149, 150 and 153 are provided around the holes 155a, 155b and 155c. The terminal pins 113 are inserted through the holes 155a, 155b and 155c, provided in the circuit board 140, and are connected to the terminal electrodes 149, 150 and 153.

The dielectric resonator 120 comprises a square dielectric substrate 121 and an electrode 122, provided on two opposite faces and four side faces of the dielectric substrate 121. Then, circular electrode removal portions 123 are provided roughly in the center of the electrode 122 on the opposite two faces, opposite to each other. Furthermore, a concave portion 131 for holding the dielectric resonator 120 is provided in the case 130.

The case 130, with the dielectric resonator 120 held therein, is placed on the stem 112, and the circuit board 140 is mounted on the case 130. In this way, the cap 111 is hermetically sealed over the stem 112, on which the case 130 holding the dielectric resonator 120 and the circuit board 140 are mounted.

In an oscillator used at high-frequency bands such as a milliwave band, even a slight discrepancy in the size of the components or their positions etc., will effect the resulting characteristics to a degree which cannot be ignored. For instance, when the positional relationship between the dielectric resonator and the circuit board changes, the coupling between the striplines provided on the circuit board and the dielectric resonator will be altered. This has a considerable effect on the oscillating frequency, the oscillating output, and the like, and as a consequence, the characteristics of the oscillator are unstable. Therefore, in order to manufacture a stable oscillator having desired characteristics, the positional relationship between the dielectric resonator and the circuit board must be adjusted with a precision of below 0.1 mm.

To carry out this adjustment, the dielectric resonator is provided in the concave portion of the case, the circuit board is mounted on the case, and this assembly is covered with the cap. The characteristics of the oscillator are then measured. When the desired characteristics are not obtained, the cap and the circuit board are removed, the position of the dielectric resonator is changed, the circuit board is remounted, the cap is replaced, and the characteristics of the oscillator are measured once more. This operation is repeated until the desired characteristics are obtained.

Thus, in the oscillator shown in FIG. 5, the operation of removing the circuit board and the cap to change the position of the dielectric resonator, and then remounting the circuit board and replacing the cap, must be carried out many times. Consequently, considerable time is needed to obtain an oscillator having the desired characteristics, leading to increased manufacturing costs.

SUMMARY OF THE INVENTION

The oscillator of the present invention has been realized in consideration of the problems described above.

The oscillator of the present invention comprises a dielectric resonator, a circuit board, and an adjustment mechanism for changing the relative positional relationship of the dielectric resonator and the circuit board; the dielectric resonator comprising a dielectric substrate, electrodes, provided on two opposite faces of the dielectric substrate, and electrode removal portions, provided at predetermined positions on the electrodes; and the adjustment mechanism comprising a force-applying unit and a movable structure for moving the dielectric resonator, and a force-applying unit and a movable structure for moving the circuit board.

Preferably, the movable structure for moving the dielectric resonator is a concave portion larger than the dielectric resonator, provided in a case for storing the dielectric resonator, the concave portion having a two-level structure for providing a vacant portion around the electrode removal portions of the dielectric resonator.

The force-applying unit for moving the dielectric resonator comprises screws.

Alternatively, the force-applying unit for moving the dielectric resonator comprises screws and elastic members.

In a preferable arrangement of the invention, the movable structure for moving the circuit board comprises oval holes for inserting terminal pins.

The oscillator may use a force-applying unit and a movable structure for moving the dielectric resonator in one axial direction parallel to a horizontal direction, and use a force-applying unit and a movable structure for moving the dielectric resonator at a right angle to the axial direction.

Alternatively, the arrangement may be such that the oscillator uses a force-applying unit and a movable structure for moving the dielectric resonator in one axial direction parallel to a horizontal direction, and uses a force-applying unit and a movable structure for moving the circuit board at a right angle to the axial direction.

A communications device according to the present invention comprises a circuit for transmitting, a circuit for receiving, and an antenna, wherein the circuit for transmitting and/or the circuit for receiving comprise the oscillator of the present invention.

Consequently, the dielectric resonator and the circuit board can be moved without removing the circuit board and the cap.

DESCRIPTION OF THE PREFERRED EMBODIMENTS

Figure 1:
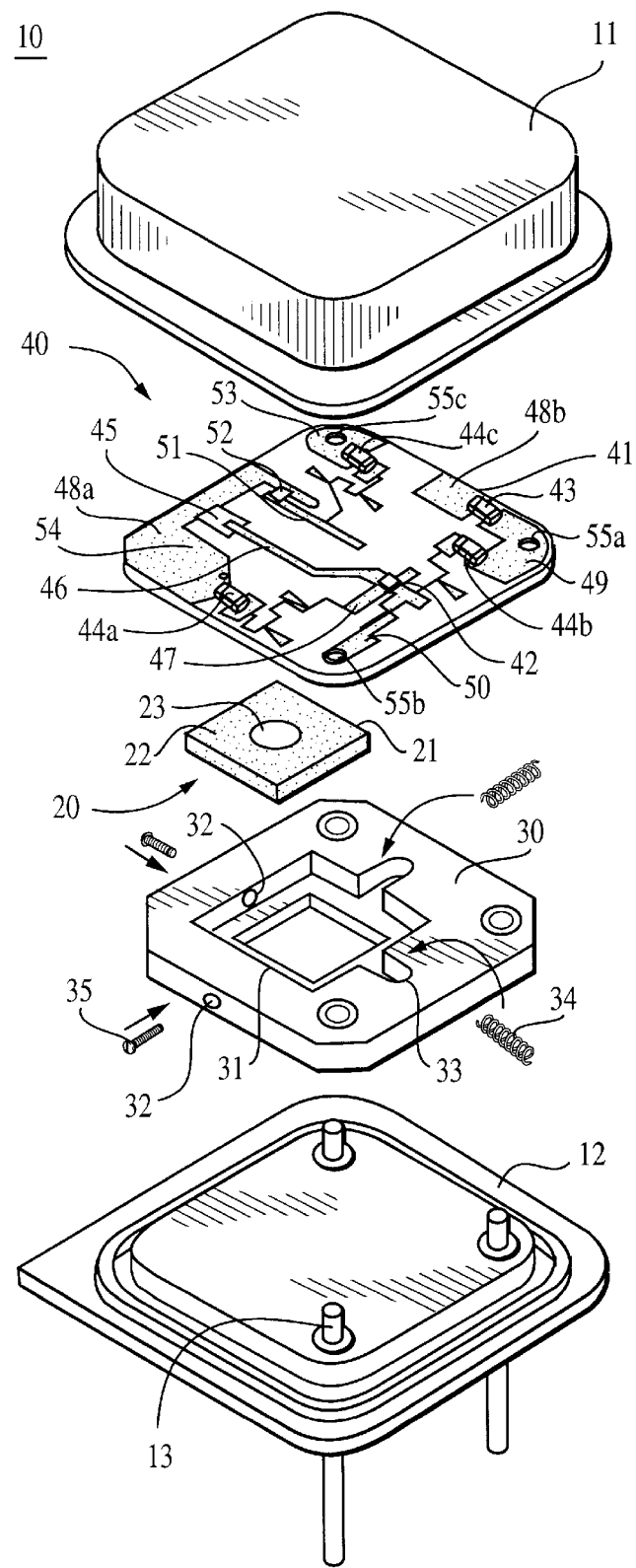
FIG. 1 is an exploded perspective view of an oscillator of the present invention.

There will be detailed below an embodiment of the present invention with reference to FIG. 1.

An oscillator 10 of the present invention comprises a cap 11, a circuit board 40, a dielectric resonator 20, a case 30 and a stem 12. The cap 11, the case 30 and the stem 12 should preferably have roughly the same coefficient of linear expansion as the dielectric resonator 20. They may acceptably comprise steel. The cap 11 and the stem 12 are hermetically sealed together. Furthermore, terminal pins 13 are provided at three corners of the stem 12.

The dielectric resonator 20 comprises an electrode 22, provided on two opposite faces of a square dielectric substrate 21, and a substantially disk-like electrode removal portion 23 is provided roughly in the center of the electrode 22. Furthermore, the electrode 22 also covers the four side faces of the dielectric substrate 21, and functions as a ground. The dielectric resonator 20 functions as a resonator when an electromagnetic field becomes concentrated near the substantially disk-like electrode removal portion 23.

Figure 2:
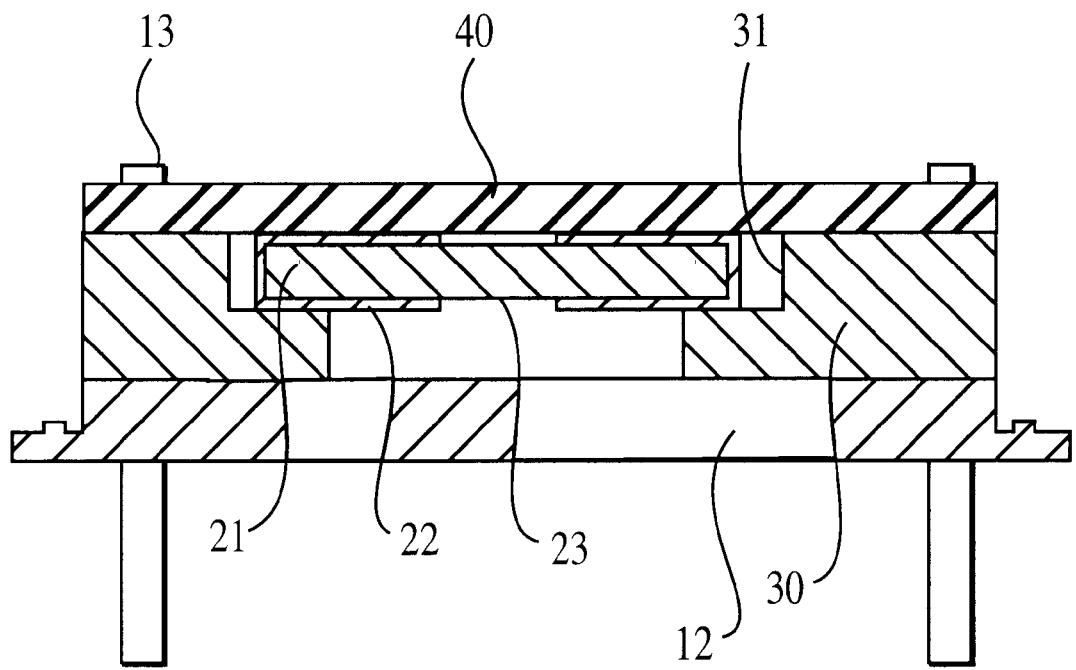
FIG. 2 is a cross-sectional view of a case, a dielectric resonator and a circuit board of the present invention.

A concave portion 31, which the dielectric resonator 20 can fit into, is provided roughly in the center of the case 30. A step projects from the side wall of the concave portion 31 and supports part of the lower face of the dielectric resonator 20. Consequently, a space is formed below the electrode removal portion 23 (FIG. 2). The dielectric resonator 20 is held in the concave portion 31, and should preferably be of a size such that it is able to move a certain degree in a direction parallel to the top face of the step in the concave portion 31, and does not drop into the opening. Through holes with screws 32 in them are provided in two adjacent side faces of the case 30 and reach as far as the inside face of the concave portion 31. Furthermore, notches 33 for holding elastic members are provided opposite with and facing the screws 32 with the dielectric resonator 20 in between them. Springs 34, forming elastic members, are provided in the notches, and are clasped by the side faces of the dielectric resonator 20 and the side faces of the notches 33.

The circuit board 40 comprises a stripline pattern on an insulated substrate 41, a FET 42, a chip capacitor 43, chip resistors 44a, 44b and 44c, a film-like terminal resistor 45 and a varactor diode 52. One end of a main line 46, comprising a stripline, is connected to the gate of the FET 42, and the other end is connected to a film-like terminal resistor 45. Furthermore, the stripline 47, which connects to the source of the FET 42, is connected via the chip resistor 44a to a ground electrode 48a. One of the striplines connecting to the drain of the FET 42 is connected via the chip resistor 44b to an input terminal electrode 49. The input terminal electrode 49 connects via the chip capacitor 43 to a ground electrode 48b. The other stripline connecting to the drain of the FET 42 is connected via a capacitor component, comprising a gap, to an output terminal electrode 50.

An auxiliary line 51 is connected at a predetermined position via the varactor diode 52 to the ground electrode 48a. Furthermore, a stripline extracted at another position on the auxiliary line 51 connects via the chip resistor 44c to a bias terminal electrode 53. When a voltage is applied to the varactor diode 52, the capacitance of the varactor diode 52 changes, whereby the oscillating frequency of the oscillator 10 can be changed.

The ground electrodes 48a and 48b pass through the through holes 54 and connect to ground electrodes (not shown in the diagram) provided on the rear surface of the circuit board 40. The ground electrodes on the rear surface of the circuit board 40 are connected to the case 30 when the circuit board 40 is mounted on the case 30, thereby grounding the circuit. The ground electrodes on the rear surface of the circuit board 40 are not provided on portions corresponding to the electrode removal portions 23 of the dielectric resonator 20, so that the striplines on the top face of the circuit board 40 can be coupled to the dielectric resonator 20.

The case 30 is provided on the stem 12, and the dielectric resonator 20 is held inside the concave portion 31 of the case 30. The circuit board 40 is mounted on the case 30, and the cap is hermetically sealed over it to form the oscillator 10. The terminal pins 13, provided at three corners of the stem 12 and the case 30, are inserted through holes 55a, 55b and 55c, provided respectively in the input terminal electrode 49, the output terminal electrode 50 and the bias terminal electrode 53 of the circuit board 40, and connect respectively to the terminal electrodes 49, 50 and 53. The holes 55a, 55b and 55c, provided in the circuit board 40, are the same shape as the terminal pins 13 so as to be always connected thereto.

Below, the mechanism for adjusting the relative positions of the dielectric resonator 20 and the circuit board 40 of the present invention will be explained.

A thermosetting adhesive is applied in the step portion of the two-level concave portion 31 of the case 30, provided on the stem 12, and the dielectric resonator 20 is provided therein. Elastic members, in this case springs 34, are provided between the dielectric resonator 20 and the notches 33. The elastic members are not limited to the springs 34, and may be rubber or the like. Then, the circuit board 40 is mounted on the case 30 and the cap is placed over it. A cap for adjusting is used, i.e., a cap having holes at positions corresponding to the screwed through holes 32 in the case 30.

Force-applying screws 35 are inserted from two directions through the holes in the cap of the oscillator, so as to touch the side faces of the dielectric resonator 20. Moreover, inserting the screws 35 and applying a pressing force against the dielectric resonator 20 alters its position. Since the screws 35 are inserted from directions intersecting at a right angles, the dielectric resonator 20 can be freely moved vertically and horizontally. The characteristics are measured each time the position of the dielectric resonator 20 is altered. In the position at which desired characteristics have been obtained, the structure is heated until the thermosetting adhesive sets, thereby fixing the dielectric resonator 20 in position. Finally, the oscillator 10 is completed by replacing the cap for adjusting with a conventional cap 11 which has no holes.

The dielectric resonator 20 may be moved using rods or the like, but it can be moved more precisely by using the screws 35. The distance moved by the dielectric resonator 20 is evenly adjusted in direct proportion to the number of rotations of the screws 35, and therefore the dielectric resonator 20 can be moved with accuracy. Furthermore, springs 34 are provided facing the screws 35, with the dielectric resonator 20 in between, thereby resiliently biasing the dielectric resonator 20. Therefore, the dielectric resonator 20 can be moved back by loosening the screws 35. Even without elastic members such as the springs 34, the position of the dielectric resonator 20 can be very precisely adjusted by accurately inserting the screws 35.

In this embodiment, the characteristics are measured when the screws 35 and the springs 34 are touching the side faces of the dielectric resonator 20. This is because, in the dielectric resonator 20 used in the oscillator 10 of the present invention, the touching of the screws 35 and the spring 34 has no great effect on the characteristics. That is, in the dielectric resonator 20 used in the present invention, the electromagnetic field is concentrated at the disk-like electrode removal portion 23, and consequently the presence of the screws 35 and the spring 34 has almost no effect on the electromagnetic field of the dielectric resonator 20.

The description of this embodiment referred to a voltage-controlled oscillator using the varactor diode 52, but the present invention is not limited to this. For instance, the present invention can be applied to an oscillator which does not use the auxiliary line 51 portion, or an oscillator which uses a gunn diode instead of the FET 42, etc.

Figure 3:
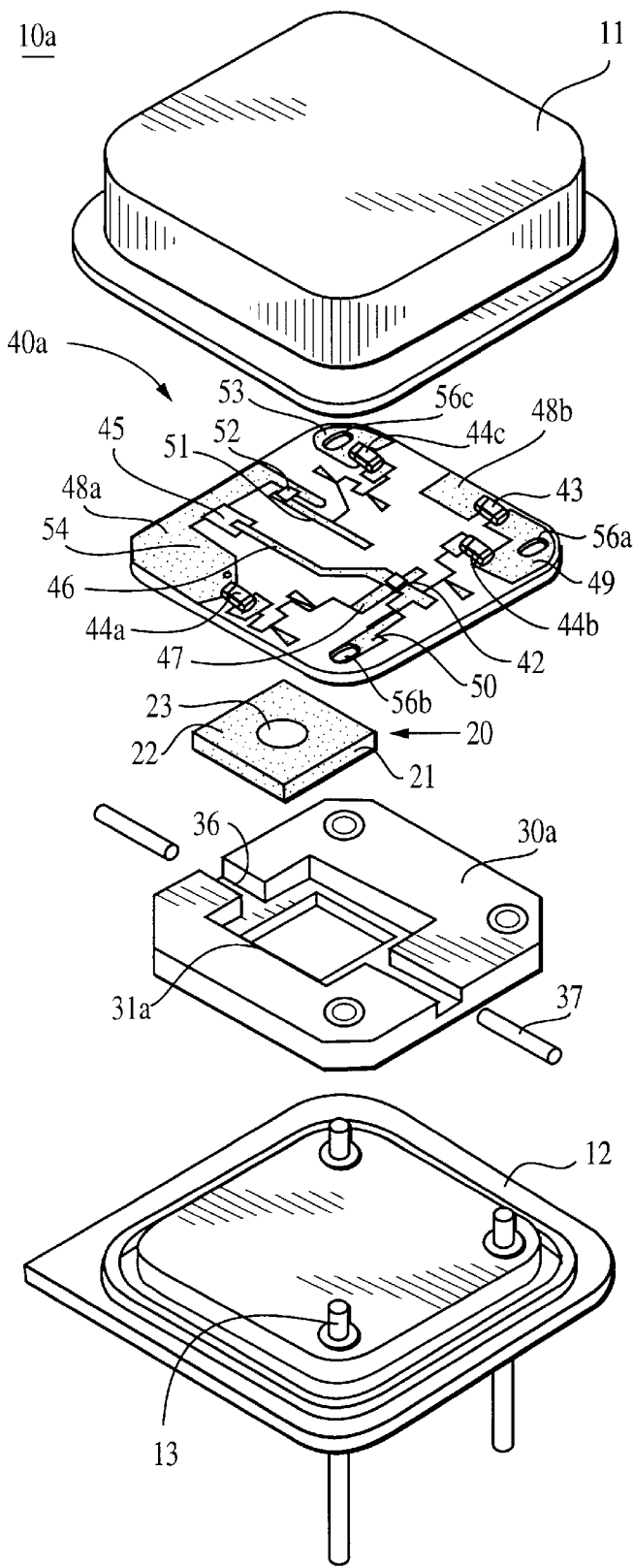
FIG. 3 is an exploded perspective view of an oscillator according to a second embodiment of the present invention.

A second embodiment of the present invention will be explained based on FIG. 3. Portions which are the same as in the preceding embodiment are represented by the same reference numerals, and detailed explanation of these portions is omitted. FIG. 3 is an exploded perspective view of an oscillator.

In this embodiment, the concave portion 31a of the case 30a has the same width as the dielectric resonator 20 in one direction, but is wider than the dielectric resonator 20 in the other direction. With a concave portion 31a of such a structure, the dielectric resonator 20 can be moved in the direction in which the width of the concave portion 31a is wider. Further, grooves 36, running from the two opposing outside faces of the case 30a to the concave portion 31a of the case 30a, are provided. These grooves 36 enable rods or the like to be inserted to move the dielectric resonator 20.

The holes 56a, 56b and 56c for inserting the terminal pins 13 are provided on the terminals electrodes 49, 50 and 53, and are oval, being a shape formed by extending the diameter of a disk in a direction at a right angle to the direction which the dielectric resonator 20 moves. To maintain the connection with the terminal pins 13, the oval holes 56a, 56b and 56c have the same width as the terminal pins 13 in the direction which is at a right angle to the direction which the circuit board 40a moves.

The oscillator is covered with a cap for adjusting (not shown), as in the previous embodiment. However, in this case, the cap for adjusting has holes in its four side faces in order to move the circuit board 40a as well as the dielectric resonator 20.

To move the dielectric resonator 20, rods 37 are inserted through the holes in the cap to apply force to the resonator 20. The rods 37 pass through the grooves 36 and touch the dielectric resonator 20. Since the rods 37 are inserted from opposite side faces, the dielectric resonator 20 can be freely moved in either direction. Similarly, the circuit board 40a can be moved at a right angle to the dielectric resonator 20 by inserting the rods 37 from two side faces which are at right angles to the direction which the dielectric resonator 20 moves. That is, by moving the dielectric resonator 20 in one direction and the circuit board 40a in another direction, which is at a right angle thereto, it is possible to alter the relative positional relationship between the dielectric resonator 20 and the circuit board 40a, both horizontally and vertically. After carrying out such adjustment until the desired characteristics are obtained, the cap is replaced by a conventional cap with no holes to form the oscillator 10a. Furthermore, the circuit board 40a is soldered to the terminal pins 13. With such a construction, the adjustment takes less time to perform. In addition, there are fewer components than in the first embodiment, enabling the oscillator 10a to be manufactured at lower cost.

In this embodiment, rods were used to apply force, but alternatively screws may be used. Further, although the position was altered by inserting the rods from two opposing side faces of the dielectric resonator and the circuit board, it is acceptable to dispense with the grooves and provide a spring between the case and the dielectric resonator, whereby the spring pushes back. This increases the number of components, but has the advantage of making adjustment less time-consuming.

Next, a communications device of the present invention will be explained based on FIG. 4, which shows a schematic view of the communications device of the present invention.

Figure 4:
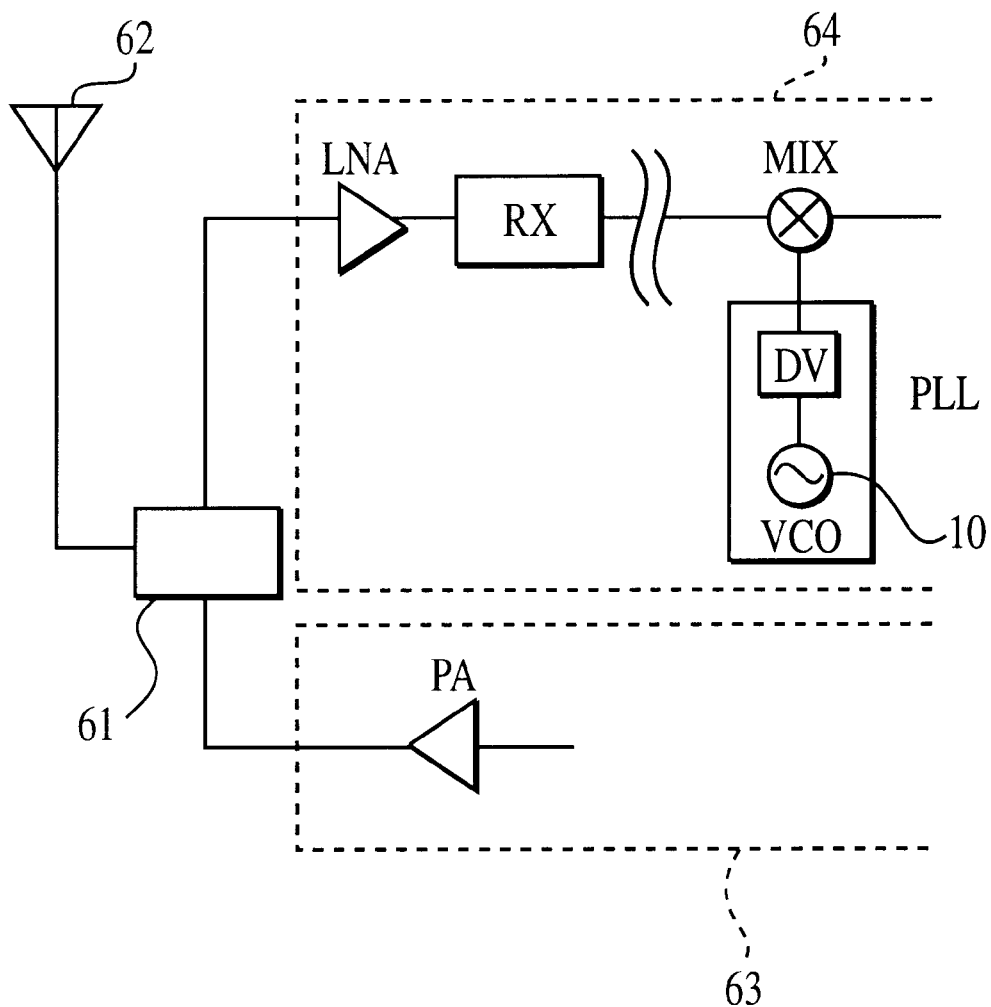
FIG. 4 is a schematic diagram of a communications device of the present invention.
Figure 5:
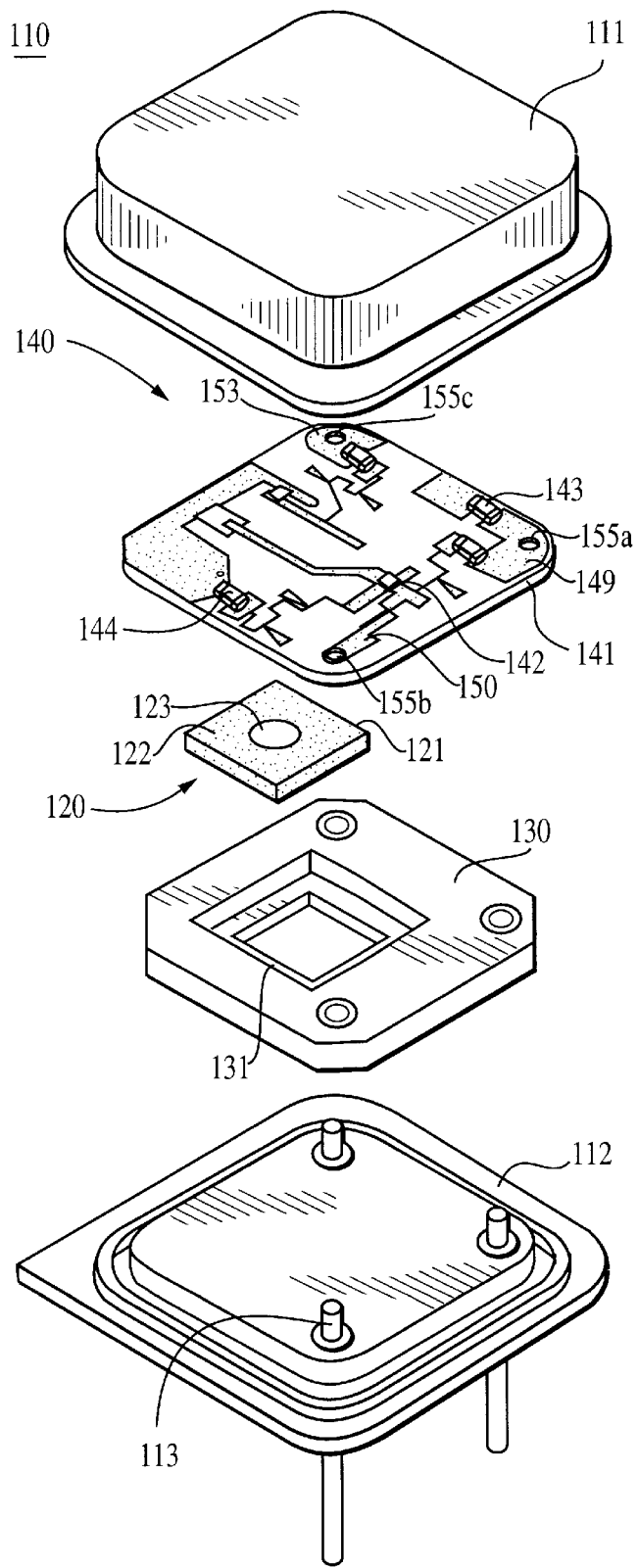
FIG. 5 is an exploded perspective view of a conventional oscillator.

As shown in FIG. 4, the communications device 60 of the present invention comprises a duplexer 61, comprising a filter for transmitting and a filter for receiving, an antenna 62, which connects to a terminal for antenna connection of the duplexer 61, a circuit for transmitting 63, connected to input/output terminals of the filter for transmitting of the duplexer 61, and a circuit for receiving 64, connected to input/output terminals of the filter for receiving of the duplexer 61.

The circuit for transmitting 63 has a power amplifier (PA) for power-amplifying the transmission signal, which passes through the filter for transmitting and is emitted from the antenna 62. Furthermore, reception signal is passed from the antenna 62 through the filter for receiving, and is received by the circuit for receiving 64. After passing a low-noise amplifier (LNA) and a filter (RX) in the circuit for receiving 64, the signal is input to a mixer (MIX). The base oscillator is a phase-locked loop (PLL), comprising an oscillator (VCO) and a divider (DV), and outputs a local signal to the mixer. The mixer outputs at intermediate frequency.

As a result, it is possible to provide a communications device which is less time-consuming and inexpensive to manufacture. This embodiment described an example using the oscillator as the circuit for receiving, but the communications device of the present invention is not limited to this, and can be applied when the oscillator is used as the circuit for transmitting, or when an oscillator is used in both.

The present invention described above comprised an adjustment mechanism for changing the relative positional relationship between the dielectric resonator and the circuit board. Consequently, when adjusting the characteristics of the oscillator, it is not necessary to remove the cap and the circuit board each time the characteristics are measured, thereby reducing the amount of time consumed when manufacturing and lowering manufacturing costs.

Furthermore, screws were used as force-applying means to move the dielectric resonator. Consequently, the dielectric resonator can be moved a distance fixed by the number of rotations of the screws. Similarly, springs were used as force-applying means. Consequently, a pushing-back force was generated, enabling the dielectric resonator to be more freely moved.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An oscillator, comprising:
   a dielectric resonator including a dielectric
   a circuit board in electronic communication with the dielectric resonator; and
   an adjustment mechanism operable to change a position of said dielectric resonator with respect to said circuit board, said adjustment mechanism including, a first force-applying structure and a first movable structure operable to move said dielectric resonator, and second force-applying structure and a second movable structure operable to move said circuit board.

2. The oscillator according to claim 1, wherein said first movable structure operable to move said dielectric resonator includes a concave portion larger than said dielectric resonator which holds said dielectric resonator, the concave portion having a two-level structure for providing a vacant portion around said electrode removal portions of said dielectric resonator.

3. The oscillator according to claim 1, wherein said first force-applying structure comprises screws.

4. The oscillator according to claim 1, wherein said first force-applying structure comprises screws and elastic members.

5. The oscillator according to claim 1, wherein said second movable structure comprises holes for inserting terminal pins, the holes being oval.

6. The oscillator according to claim 1, wherein
   said first force-applying structure and first movable structure are operable to move said dielectric resonator horizontally in one axial direction; and
   said oscillator further comprises a third force-applying structure and a third movable structure operable to move said dielectric resonator at a right angle to said axial direction.

7. The oscillator according to claim 1, wherein
   said first force-applying structure and said first movable structure are operable to move said dielectric resonator horizontally in one axial direction; and
   said second force-applying structure and said second movable structure are operable to move said circuit board at a right angle to said axial direction.

8. A communications device, comprising:
   a circuit for transmitting;
   a circuit for receiving; and
   an antenna,
   wherein at least one of said circuit for transmitting and said circuit for receiving comprises an oscillator, the oscillator comprising:
   a dielectric resonator including a dielectric substrate, electrodes provided on two opposite faces of the dielectric substrate, and electrode removal portions provided at predetermined positions on said electrodes;
   a circuit board in electronic communication with the dielectric resonator; and
   an adjustment mechanism operable to change a position of said dielectric resonator with respect to said circuit board, said adjustment mechanism including, a first force-applying structure and a first movable structure operable to move said dielectric resonator, and second force-applying structure and a second movable structure operable to move said circuit board.

9. An oscillator, comprising:
   a dielectric resonator including a dielectric substrate;
   a circuit board in electronic communication with the dielectric resonator;
   a case having a concave portion sized and shaped to receive the dielectric resonator; and
   an adjustment mechanism operable to change the position of said dielectric resonator with respect to said circuit board in a first lateral direction and a second lateral direction, transverse to the first lateral direction, said adjustment mechanism including:
   a first force-applying structure extendable into said concave portion of said case and operable to move said dielectric resonator in said first lateral direction;
   a first resilient member disposed opposite to said first force-applying structure and operable to resist movement of said dielectric resonator in said first lateral direction;
   a second force-applying structure extendable into said concave portion of said case and operable to move said dielectric resonator in said second lateral direction; and
   a second resilient member disposed opposite to said second force-applying structure and operable to resist movement of said dielectric resonator in said second lateral direction.

10. The oscillator according to claim 9, wherein said first and second force-applying structures are screws.

11. The oscillator according to claim 9, wherein said first and second resilient members are springs.

12. The oscillator according to claim 9, wherein
    said dielectric substrate has a substantially parallelepiped shape; and
    said case includes:
    first and second walls spaced sufficiently apart to permit said dielectric resonator to slide in a first lateral direction;
    third and fourth walls spaced sufficiently apart to permit said dielectric resonator to slide in a second lateral direction, perpendicular to the first lateral direction;
    a first aperture extending through said case through which said first force-applying structure extends to move said dielectric resonator in the first lateral direction; and
    a second aperture extending through said case through which said second force-applying structure extends to move said dielectric resonator in the second lateral direction.

13. The oscillator according to claim 12, wherein
    said first aperture includes a threaded bore through which a first screw extends to apply force to said dielectric resonator; and
    said second aperture includes a threaded bore through which a second screw extends to apply force to said dielectric resonator.

14. An oscillator, comprising:
    a dielectric resonator including a dielectric substrate having a substantially parallelepiped shape;
    a case operable to receive the dielectric resonator and having a concave portion including:

first and second walls spaced sufficiently apart to permit said dielectric resonator to slide in a first lateral direction;

third and fourth walls spaced apart such that said dielectric resonator does not slide along a second lateral direction, perpendicular to the first lateral direction;

at least one aperture extending through said case such that an external force may move said dielectric resonator in the first lateral direction; and a circuit board in electronic communication with the dielectric resonator and including at least two elongated apertures extending in said second lateral direction; and a base having alignment members engaging said elongated apertures of said circuit board such that said circuit board is slidable in the second lateral direction.

* * * * *